United States Patent [19]

George

[11] 3,823,379

[45] July 9, 1974

[54] TELEVISION AUTOMATIC GAIN CONTROL CIRCUITRY PROVIDING FOR COMPATIBLE CONTROL OF VHF TUNER AND UHF TUNER

[75] Inventor: John Barrett George, Indianapolis, Ind.

[73] Assignee: RCA Corporation, New York, N.Y.

[22] Filed: May 21, 1973

[21] Appl. No.: 362,644

[52] U.S. Cl......... 325/405, 178/7.3 R, 178/7.3 DC, 325/410

[51] Int. Cl........................... H04b 1/16, H04n 5/52

[58] Field of Search........... 178/7.3 R, 7.3 D–7.3 C, 178/7.5 D–7.5 C; 325/319, 400, 404, 405, 408–411; 330/35, 38 M

[56] References Cited

UNITED STATES PATENTS

| | | | |
|---|---|---|---|
| 3,242,433 | 3/1966 | Carlson et al. | 325/400 |
| 3,693,091 | 9/1972 | Russell | 325/405 |

*Primary Examiner*—Albert J. Mayer
*Assistant Examiner*—Marc E. Bookbinder
*Attorney, Agent, or Firm*—Eugene M. Whitacre

[57] ABSTRACT

A television automatic gain control circuit which transforms the low input impedance of the gain control terminal of a stage such as a grounded base bipolar transistor RF amplifier of a UHF tuner or a PIN diode attenuator utilized for tuner gain reduction to an impedance comparable to that of the impedance of the gain control terminal of an MOS/FET transistor used as an RF amplifier of a VHF tuner. Additionally, the control circuit provides for clamping of the AGC voltage at a selected level to provide AGC delay different from VHF AGC delay. Also, a predetermined voltage offset is provided to translate the AGC voltage applied to the RF amplifier of the VHF tuner before being applied to the gain controlled stage of the UHF tuner.

9 Claims, 4 Drawing Figures

TELEVISION AUTOMATIC GAIN CONTROL CIRCUITRY PROVIDING FOR COMPATIBLE CONTROL OF VHF TUNER AND UHF TUNER

BACKGROUND OF THE INVENTION

The invention relates to automatic gain control (AGC) of television tuners, and more particularly, to a system incorporated in a UHF tuner which provides for gain control of a bipolar transistor radio frequency (RF) amplifier of the UHF tuner from a high impedance AGC source suited for gain control of a standard VHF tuner employing a vacuum tube or an MOS/FET RF amplifier.

U.S. Pat. No. 3,688,198 issued to me Aug. 29, 1972, and entitled, "VHF and UHF Automatic Gain Control Circuitry Derived from a Single Control Voltage," describes a television receiver employing a VHF tuner including both an MOS/FET RF amplifier which is gain controlled from a high impedance AGC source and a system for adapting the AGC control signal to the gain control requirements of a bipolar transistor RF amplifier of a UHF tuner.

The system for adapting the AGC control signal matches the normally high resistance of the AGC circuit to the normally low input resistance of the RF amplifier of the UHF tuner. To provide for the impedance transformation, the system has a Darlington transistor input circuit having a high input resistance with the base electrode coupled to the AGC source, the emitter electrode coupled to ground and the collector electrode coupled to the UHF tuner RF amplifier. Since the AGC control signal range required to gain control MOS/FET or vacuum tube RF amplifier of most VHF tuners includes a range of negative voltage and since the base of the Darlington transistor is not responsive to these negative voltages, a portion of the AGC control signal does not alter the gain of the UHF tuner.

The resistor used to couple the base electrode of the Darlington transistor to the AGC source was made relatively small to prevent beta (B) variations and leakage currents of the Darlington transistor from varying the AGC voltage at the base electrode. The small value of this resistor dictated that a collector-emitter bias power supply be maintained during VHF operation to prevent loading of the AGC control signal.

The collector electrode of the Darlington transistor provided a voltage for the gain control of the RF amplifier of the UHF tuner. A side effect of the change of this voltage was the detuning of the RF amplifier which caused performance degradation if not compensated for by additional circuitry.

SUMMARY OF THE INVENTION

In accordance with the present invention, a gain control system is provided for a television receiver including a first tuner for processing television signals in a first band of frequencies and a second tuner for processing television signals in a second band of frequencies. The first tuner has a first gain controllable stage with a first gain control terminal with a relatively high input resistance. The second tuner has a second gain controllable stage with a second gain control terminal with a relatively low input resistance and a relatively constant potential thereon. The system further includes an automatic gain control circuit for providing a control signal at a relatively high impedance output terminal. The control signal is conventionally applied to the first gain control terminal of said first gain controllable stage. The second tuner includes means for applying the control signal to the second gain control terminal of said second gain controllable stage which comprises a first amplifier circuit with a high resistance input terminal and an output terminal. The output terminal provides a second control signal which varies as a function of a voltage applied to the high resistance input terminal. An impedance means is coupled between the input terminal of the first amplifier circuit and the output terminal of the automatic gain control circuit for presenting a high resistance to the control signal under all conditions. Means are coupled to the high resistance input terminal of the first amplifier for providing limiting of the voltage thereon and for providing a constant current when said means is not limiting. The constant current predominantly flows through the impedance means and thus provides a fixed voltage offset between the control signal and the voltage at the high impedance input terminal of the first amplifier. The voltage offset is controlled by altering the impedance means. Means are coupled between the second gain control terminal of the second gain controllable stage and the output terminal of the first amplifier for applying the second control signal to the second gain control terminal of the second gain controllable stage of the second tuner to control the gain thereof according to the magnitude of the control voltage.

In another embodiment of the invention, the translated gain control signal obtained from the first amplifier is coupled to a gain controlled stage which in response to the gain control signal varies the impedance of a diode which serves as a signal attenuator in the gain controlled stage.

BRIEF DESCRIPTION OF THE DRAWINGS

A description of the invention will be given with reference to the following figures, in which.

DETAILED DESCRIPTION OF THE INVENTION

Figures 1, 4:
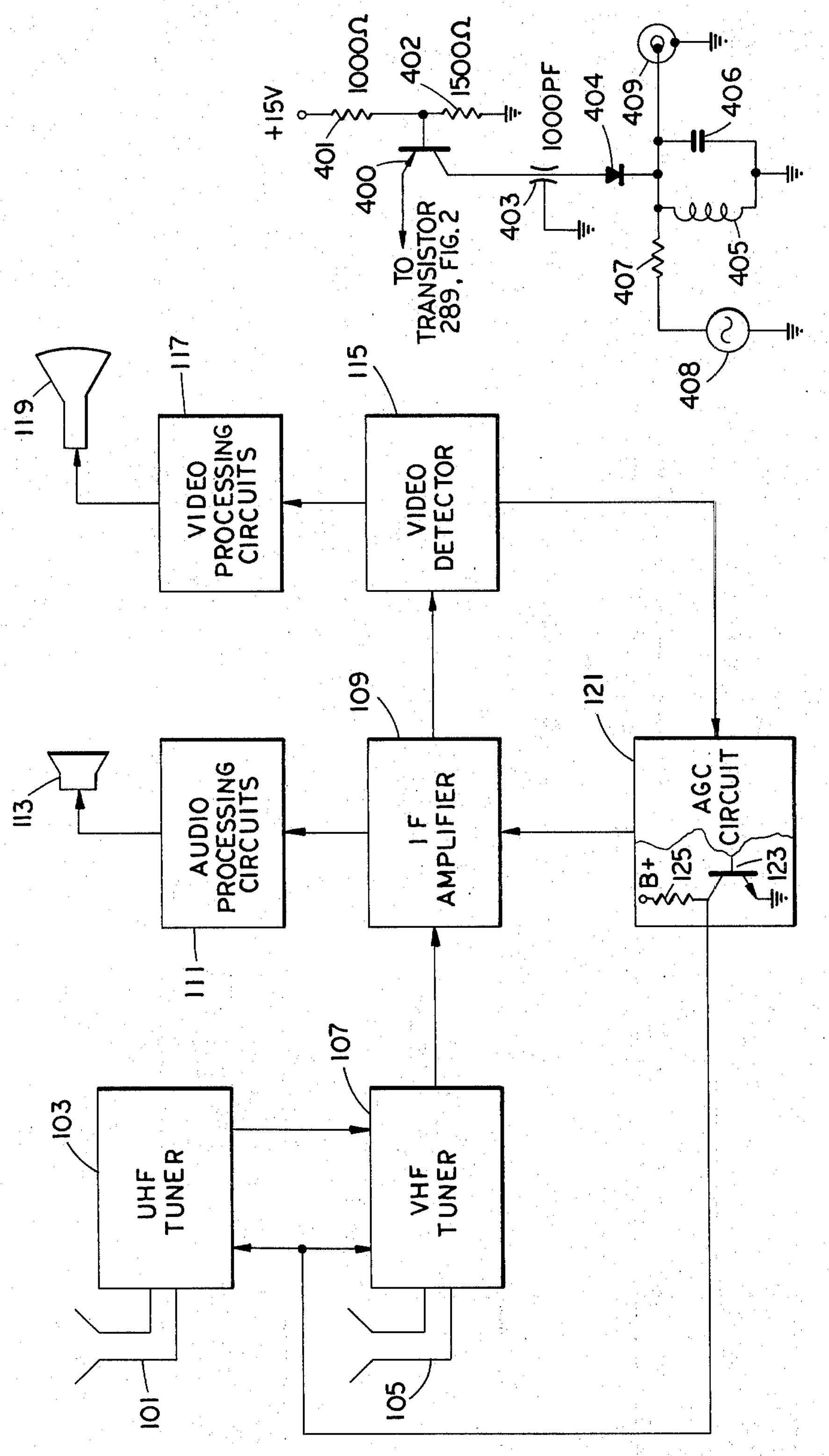
FIG. 1 is a block diagram of a television receiver including a VHF tuner and a UHF tuner, each of which has a gain controllable amplifying stage therein according to the invention.
FIG. 4 is a schematic circuit diagram of another embodiment of the invention in conjunction with FIG. 2.

In the television receiver shown in FIG. 1, signals in the UHF frequency range (470–890 MHz) are intercepted by a UHF antenna 101 and processed by a UHF tuner 103 to produce an intermediate frequency (IF) signal (approximately 43 MHz). Signals in the VHF frequency range (54–216 MHz) are intercepted by a VHF antenna 105 and processed by a VHF tuner 107 to produce an IF signal which is the same frequency as the IF signal produced by the UHF tuner 103.

The IF signal produced by the VHF tuner 107 is directly coupled to an IF amplifier 109 whereas the IF signal produced by the UHF tuner 103 is coupled to the VHF tuner 107. In coupling the IF signal of the UHF tuner 103 through the VHF tuner 107, additional IF signal amplification is provided.

The IF amplifier is coupled to an audio processing circuit 111 for processing audio IF signals present in the composite IF signal to produce an audible reproduction at the audio reproducer 113 coupled to block 111. Also, the IF amplifier 109 is coupled to a video detector 115 which produces a video signal present in the IF signal. This video signal is coupled to the video processing circuit 117 which produces information required to reproduce a picture on a kinescope 119. A video signal from detector 115 is also coupled to an automatic gain control (AGC) circuit 121.

The AGC circuit 121 compares the video signal level to a predetermined level to produce two AGC control signals. One of the AGC control signals is coupled to the IF amplifier 109 to control the gain thereof. The second signal is derived from an AGC delay network comprising an output transistor having the emitter electrode grounded and the collector electrode coupled via a resistor 125 to a source of B+. The AGC control signal at the collector electrode of transistor 123 is coupled to gain control signal input terminals of both the UHF tuner 103 and the VHF tuner 107 to provide for gain control of these tuners.

The AGC delay network including transistor 123 of AGC circuit 121 allows for gain reduction of the IF amplifier 109 prior to gain reduction of the UHF tuner 103 or the VHF tuner 107 as the signal received by the UHF antenna 101 or VHF antenna 105 increases. This delay provides for optimization of the noise figure (N.F.) of the receiver under all signal conditions.

Figure 2:
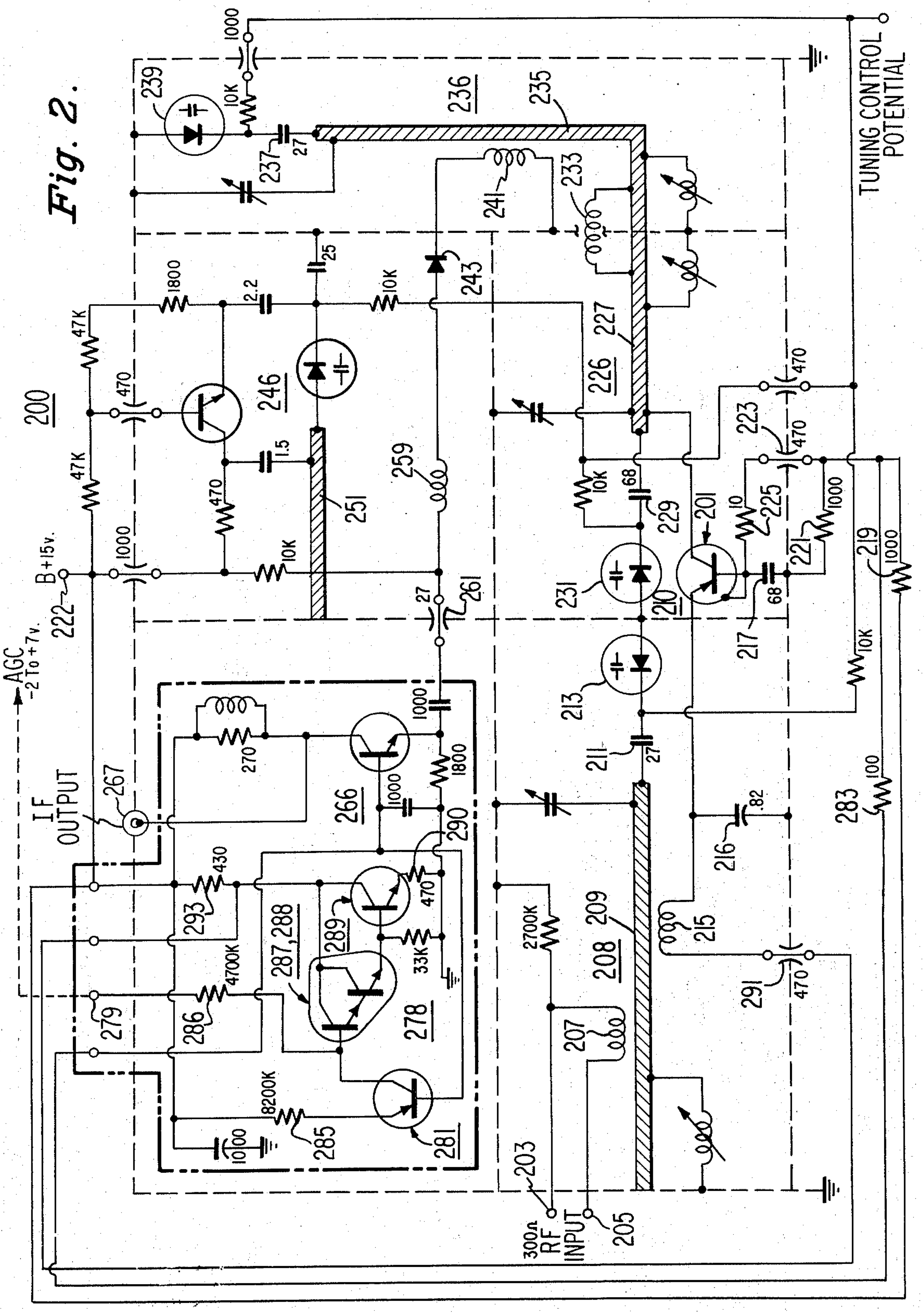
FIG. 2 is a schematic diagram of a UHF tuner, suitable for use in the receiver of FIG. 1, incorporating UHF gain control circuitry according to the invention.

Referring to FIG. 2, a UHF tuner 200 suitable for use in the receiver of FIG. 1 and incorporating UHF gain control circuitry in accordance with the invention is shown. UHF signal input terminals 203 and 205 are connected to an antenna input coil 207 which magnetically couples the UHF signal to an RF preselector circuit 208. The RF preselector circuit 208 comprises an inductor 209, a coupling capacitor 211 and a varactor diode 213 in series arrangement. This preselector is caused to resonate within the UHF band (470–890 MHz) by means of a tuning control voltage coupled to the junction of coupling capacitor 211 and varactor diode 213. The tuning control voltage varies the capacity of the varactor diode 213 and thereby varies the resonant frequency of the RF preselector circuit 208.

A drive coil 215 is magnetically coupled to inductor 209 and electrically coupled between the emitter electrode of an RF amplifier transistor 201 and a feedthrough capacitor 291. The drive coil connected in this manner provides a selected UHF signal input to RF amplifier 210.

A bias voltage for the base electrode of the RF amplifier transistor 201 is provided by a series combination of a resistor 219 and a resistor 221 coupled between B+ and ground. The junction of resistors 219 and 221 is coupled via a pi filter network comprising a feedthrough capacitor 223, a resistor 225 and a bypass capacitor 217 to the base electrode of RF amplifier transistor 201.

The collector electrode of RF amplifier transistor 201, which provides an amplified UHF signal output from RF amplifier 210, is coupled to a first post-selector circuit 226. The first post-selector circuit 226 comprises an inductor 227, a coupling capacitor 229 and a varactor diode 231 in series combination. This post-selector is caused to resonate at approximately the same frequency as the preselector 209 by means of a tuning control voltage coupled to the junction of coupling capacitor 229 and varactor diode 231.

The first post-selector circuit 226 is coupled to a second post-selector circuit 236 by means of a coupling inductor 233. The selected UHF signal present in the second post-selector circuit 236 is coupled to an inductor 241. An oscillator signal generated by an oscillator circuit 246 is coupled to an inductor 259. The inductor 241, inductor 259 and a mixer diode 243 are serially connected and provide a mixing of the oscillator signal and the selected RF signal. An IF signal which results from the signal mixing process exists at a feedthrough capacitor 261. The IF signal at feedthrough capacitor 261 is coupled to an IF amplifier 266 which provides an IF signal output at a terminal 267.

The gain of RF amplifier transistor 201, which is operated in the forward AGC mode, may be reduced by increasing its emitter electrode bias current. A feedthrough capacitor 291 provides for a bypass of RF frequencies while also coupling a gain control bias current to the emitter electrode of transistor 201.

Since the bias voltage on the base electrode of RF amplifier transistor 201 is relatively constant, the bias voltage on the emitter electrode is relatively constant. Therefore, the voltage on feedthrough capacitor 291 is relatively constant over a range of gain control bias current coupled to feedthrough capacitor 291.

An AGC translation circuit 278 provides a match of the relatively high resistance output characteristics of the AGC circuit 121 (FIG. 1) with the relatively low resistance characteristics present at the feedthrough capacitor 291 throughout the range of gain control bias current. Also, the AGC translation circuit provides a means of translating a range of voltages at the output of the AGC circuit to a range of gain control bias currents suitable for coupling to feedthrough capacitor 291.

Gain control (AGC) signals are supplied to the UHF tuner 103 from the collector electrode of transistor 123 (FIG. 1) via a terminal 279 which is coupled to the collector electrode of a transistor 281 by means of a resistor 286. The resistor 286 is of a high value (e.g., $4.7 \times 10^6$ ohms) and provides a relatively high input impedance at terminal 279 to prevent loading of the AGC control signal at terminal 279. A resistor 285 is connected between the emitter electrode of transistor 281 and the source of B+ terminal 222. A resistor 283 is connected between the base electrode of transistor 281 and the junction of voltage divider resistors 219 and 221 to provide a fixed voltage bias on the base electrode of transistor 281. In this configuration the transistor 281 has a substantially constant collector current until the gain control signal at the terminal 279 exceeds a critical level of voltage. This level of voltage is determined by the point at which transistor 281 saturates. Saturation occurs when the voltage at terminal 279 plus the voltage drop across resistor 286 equals the emitter voltage of transistor 281 minus the saturation voltage of transistor 281. If this critical level of voltage is exceeded the collector voltage will be clamped so that any voltages placed on terminal 279 more positive than the critical level will not change the collector voltage of transistor 281.

The AGC input signal supplied via terminal 279 and resistor 286 is also connected to the base electrode of a Darlington transistor combination 287, 288, the emitter of which is connected to the base electrode of a signal inverting transistor 289. The emitter electrode of transistor 289 is coupled to ground through a resistor 290 and the collector electrode is coupled to B+ terminal 222 through a resistor 293. The collector electrode of transistor 289 is also coupled to feedthrough capacitor 291 to provide a translated gain control signal thereto.

Figure 3:
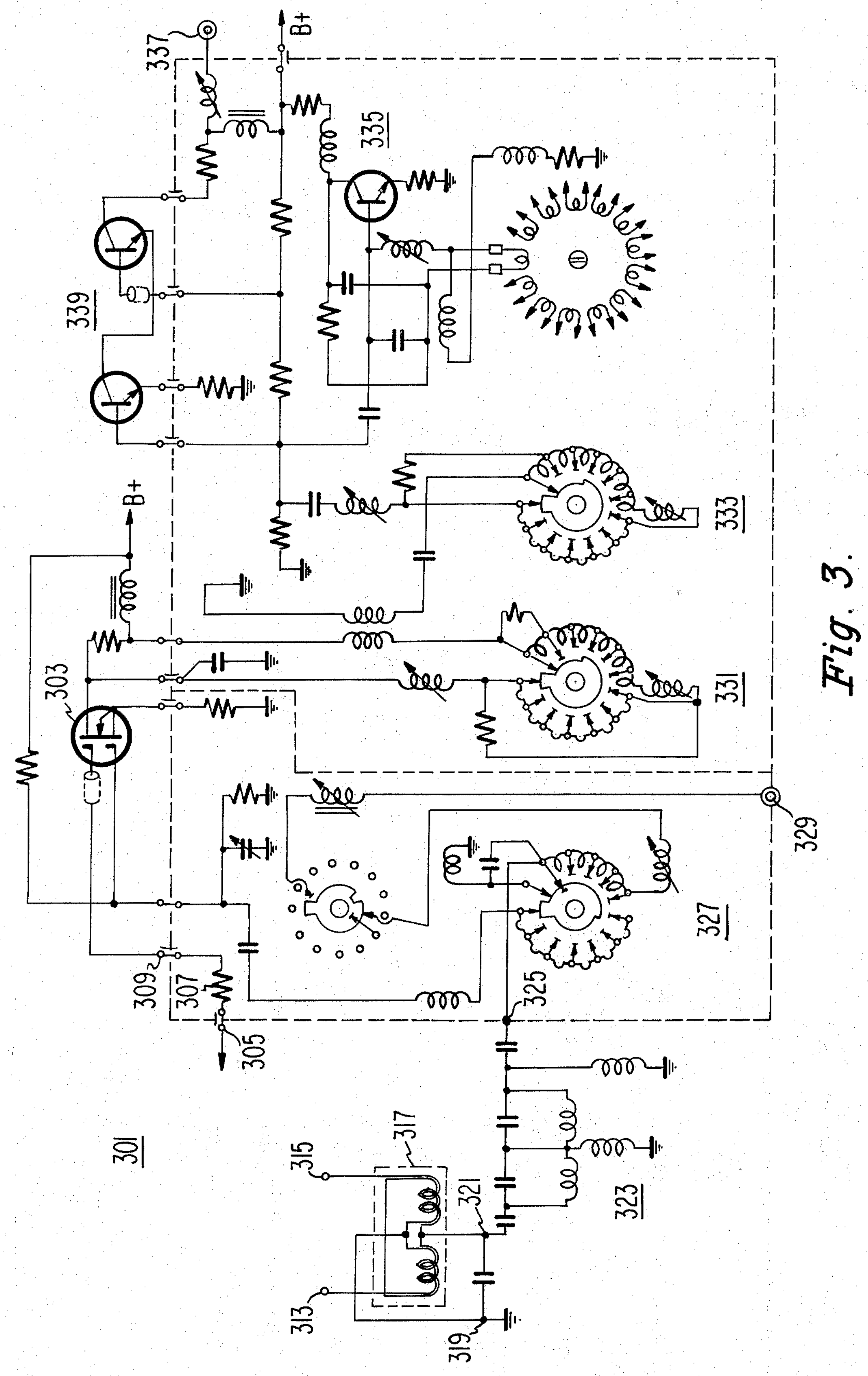
FIG. 3 is a schematic diagram of a VHF tuner suitable for use in the receiver of FIG. 1 to be gain controlled according to the invention.

FIG. 3 shows a VHF tuner 301 suitable for use in the receiver of FIG. 1 which employs an MOS/FET transistor 303 connected in a common-source configuration. Transistor 303 is used as an RF amplifier when receiving VHF frequencies and as an IF amplifier when receiving UHF frequencies. In each amplifying mode AGC information is supplied from the collector electrode of transistor 123 (FIG. 1) via a feedthrough capacitor 305, a resistor 307 and a feedthrough capacitor 309, the latter being coupled to a second control gate of transistor 303. Feedthrough capacitors 305 and 309 cooperate with resistor 307 to prevent RF signals from being coupled to this control gate. Feedthrough capacitor 309 also serves to bypass the second gate to RF ground thus providing cascode operation of transistor 303. The DC impedance looking into feedthrough capacitor 305 in this configuration is very high; therefore, a relatively small current is required from the RF AGC circuit 121 (FIG. 1) to provide gain control of the transistor 303.

VHF input signals are coupled from antenna 105 (FIG. 1) via terminals 313 and 315, a balun assembly 317, terminal 319 and an antenna filter 323 to a terminal 325 of an RF selector circuit 327 of the VHF tuner 301.

The RF selector circuit 327 contains appropriate switching to couple terminal 325 or an IF input terminal 329 to a first control gate of transistor 303, thus providing for RF amplification of VHF television signals or IF amplification of signals converted by UHF tuner 200 (FIG. 2) and coupled from terminal 267 (FIG. 2) to terminal 329. The drain electrode of transistor 303 is coupled to a second RF selector network 331 which, in turn, is coupled to a third RF selector circuit 333. A local oscillator circuit 335 and RF selector circuit 333 are coupled to an input terminal of a cascode mixer 339. An output terminal of mixer circuit 339 is coupled to an IF output terminal 337.

UHF OPERATION

The AGC control voltage coupled to terminal 279 of UHF tuner 200 (FIG. 2) and terminal 305 of VHF tuner 301 (FIG. 3) varies in magnitude with variations of signal level received by UHF antenna 101 and VHF antenna 105 (FIG. 1). As the received signal increases, the AGC control voltage decreases (goes more negative) and as the received signal decreases the AGC control voltage increases (goes more positive). The gains of the UHF tuner 200 and the VHF tuner 301 are therefore altered in response to the variations in AGC control voltage.

The control voltage variations on terminal 279 of UHF tuner 200 (FIG. 2) and the resultant gain variations will be analyzed in three phases — low, medium and high control voltage conditions.

When a low control voltage exists on terminal 279 transistor 281 supplies a constant current through resistor 286 thus developing a voltage drop across resistor 286 which creates an offset of voltage between terminal 279 and the base of Darlington transistor combination 287, 288. The relatively low voltage on the base of Darlington transistor combination 287, 288 provides for a relatively low collector current of both Darlington transistors combination 287, 288 and inverter transistor 289. Since the voltage at feedthrough capacitor 291 and thus the collector of transistor 289 is relatively constant throughout a range of AGC control voltage and since the B+ 222 is relatively constant, the current through resistor 293 remains constant. The low collector current of Darlington transistor combination 287, 288 and transistor 289 therefore results in a relatively high current into the emitter of RF amplifier transistor 201 via feedthrough capacitor 291. The relatively high emitter current in transistor 201 provides for a relatively low gain of the RF amplifier 210.

As the AGC control voltage increases due to a decrease in received signal level, the voltage at the base of Darlington transistor combination 287, 288 increases. The collector current of Darlington transistor combination 287, 288 and inverter transistor 289 increases and the emitter current in RF amplifier transistor 201 decreases. The gain of the RF amplifier 210 therefore increases.

When the AGC control voltage at terminal 279 increases to a level where transistor 281 saturates, the voltage at the base of Darlington transistor combination 287, 288 stops increasing with further increases of the AGC control voltage at terminal 279. At the AGC control voltage where transistor 281 saturation occurs, the gain of RF amplifier 210 is a maximum.

The difference between the maximum AGC control voltage and the AGC control voltage which provides for saturation of transistor 281 provides for a signal delay through RF amplifier 201. This delay may be controlled by changing the value of the resistor 286.

VHF OPERATION

The B+ 222 (FIG. 2) is turned off during VHF operation to prevent signals generated by local oscillator 246 from interfering with VHF reception. The resistor 286 being of a high resistive value prevents any significant loading of the AGC circuits coupled to terminal 279 when the input resistance at the base of Darlington transistor combination 287, 288 drops when the B+ 222 is switched off.

FIG. 4 is a partial schematic which in conjunction with FIG. 2 constitutes another embodiment of the invention. As can be seen in FIG. 4, the emitter electrode of a transistor 400 is coupled to the collector electrode of transistor 289 in the AGC signal translation circuit 278 of FIG. 1. The operation of the circuit 278 is the same in this embodiment as in FIG. 2. However, the RF amplifier stage 201 receiving the gain control signal from circuit 278 has been replaced by the stage including transistor 400 of FIG. 4. This embodiment is useful in that it provides a means by which television input signals received by a cable instead of an antenna (such as in FIG. 2) may be gain controlled.

A voltage divider comprising serially coupled resistors 401 and 402 is coupled between a source of positive potential and ground, the junction of the resistors being coupled to the base electrode of transistor 400 for providing bias thereto. The collector electrode of transistor 400 is coupled through a bypass capacitor 403 to the anode of a PIN diode 404. The cathode of diode 404 is coupled through a peaking network comprising the parallel arrangement of an inductance 405 and a capacitor 406 to ground.

The cathode of diode 404 is also coupled through a resistor 407 to a source of signals 408, which represents television signals obtained from a cable connected to the television receiver, and to a cable signal output terminal 409.

In operation, the translated AGC signals coupled to the emitter electrode of transistor 400 controls its collector current. The collector current path is through PIN diode 404, and as the diode current is varied the impedance of the diode is varied. In turn, the varying impedance of diode 404 serves as a variable attenuator for the signals received from the source 408 and coupled to the output terminal 409. It is to be understood the terminal 409 is coupled to the signal processing circuits as described in conjunction with FIGS. 1 and 2 such that the AGC signal is ultimately derived from the incoming signals from source 408. In this manner the AGC loop is closed to provide automatic gain control of the incoming signals.

In the maximum gain condition with the AGC voltage coupled to translation circuit 278 at a positive level, transistor 400 is biased off as its base voltage is selected to cause this condition when the emitter current of transistor 400 is decreased to zero. Under this condition, the impedance of diode 404 is a maximum and the signal from source 408 is coupled to terminal 409 with minimum attenuation.

As the AGC voltage applied to circuit 278 becomes more negative in response to an increase in received signal amplitude, the emitter current, and hence the collector current, of transistor 400 increases. The resulting increased current through diode 404 lowers its impedance and the signals from source 408 are thereby attenuated as the impedance of the PIN diode 404 forms a voltage divider with the resistance 407 for reducing the incoming signal amplitude.

What is claimed is:

1. In a television receiver of the type including a first tuner for processing television signals in a first band of frequencies and a second tuner for processing television signals in a second band of frequencies, said first tuner having a first gain controllable stage including a first gain control terminal with a relatively high input resistance and said second tuner having a second gain controllable stage including a second gain control terminal with a relatively low input resistance and a relatively constant potential thereon, said receiver further including an automatic gain control circuit providing a control signal at a relatively high impedance output terminal which is conventionally applied to said first gain control terminal of said first gain controllable stage, and said first tuner including means for applying said control signal to said second gain control terminal of said second gain controllable stage, a gain control system comprising:

a first amplifier circuit having a high resistance input terminal and an output terminal, said output terminal providing a second control signal which varies as a function of a voltage applied to said high resistance input terminal;

impedance means coupled between said input terminal of said first amplifier circuit and said output terminal of said automatic gain control circuit for presenting a high resistance to said control signal under all conditions;

means coupled to said high resistance input terminal of said first amplifier for providing limiting of said voltage thereon when said voltage reaches a predetermined level and for providing a substantially constant current when said means is not limiting, said constant current predominantly flowing through said impedance means thus providing a fixed voltage offset between said control signal and said voltage at said high impedance input terminal of said first amplifier; and means coupled between said second gain control terminal of said second gain controllable stage and said output terminal of said first amplifier for applying said second control signal to said second gain control terminal of said second gain controllable stage of said second tuner for controlling the gain thereof according to the magnitude of said control voltage.

2. The combination in claim 1 wherein said means for providing limiting of said voltage thereon and for providing a constant current when said means is not limiting comprises:

a first source of bias voltage;

a transistor having a base electrode coupled to said first source of bias voltage, a collector electrode coupled to said high resistance input terminal of said first amplifier, and an emitter electrode;

a second source of bias voltage;

a first resistor coupled between said emitter electrode of said transistor and said second source of bias voltage;

said first resistor having its resistance selected for determining said constant current and said first source of bias voltage being selected for determining a limiting voltage level at said high resistance input terminal of said first amplifier.

3. The combination as in claim 2 wherein said first source of bias voltage is coupled to said second gain controllable stage.

4. The combination as in claim 3 wherein said second source of bias voltage is coupled to said second gain controllable stage.

5. The combination as in claim 3 wherein said first source of bias voltage provides a bias voltage for a transistor in said second gain controllable stage and said second source of bias voltage provides an emitter bias for said transistor in said second gain controllable stage thus providing gain stabilization of said second gain controllable stage with a variation of first and second sources of bias voltage.

6. The combination as in claim 1 wherein said first amplifier circuit comprises:

a first source of bias voltage;

a first transistor having a base electrode coupled to said high resistance input terminal, an emitter electrode and a collector electrode coupled to said output terminal;

a first resistor coupled between said emitter electrode and a point of fixed reference voltage;

a second resistor coupled between said collector electrode and said first source of bias voltage; and said resistance value of said first resistor and said second resistor being determined by control requirements of said second gain controllable stage.

7. The combination in claim 1 wherein said means for applying said second control signal to said second gain control terminal of said gain controllable stage comprises:

means for bypassing said television signals in said second band of frequencies on said second gain control terminal to a source of reference potential.

8. The combination as in claim 4 wherein said second gain controllable stage includes a transistor having a control electrode coupled to said second source of bias voltage and responsive to signals obtained therefrom for controlling the current in the main conduction path of said transistor, and a PIN diode coupled in said main conduction path of said transistor, said diode exhibiting a varying impedance as said transistor current varies in response to said second bias voltage, and a terminal to be coupled to a source of signals and coupled to said PIN diode such that said varying impedance of said PIN diode provides variable attenuation for signals obtained from said source.

9. In a television receiver of the type including a first tuner for processing television signals in a first band of frequencies and a second tuner for processing television signals in a second band of frequencies, said first tuner having a first gain controllable amplifier having a first gain control terminal with a relatively high input resistance and said second tuner having a second gain controllable amplifier having a second gain control terminal with a relatively low input resistance and a relatively constant potential thereon, said receiver further including an automatic gain control circuit providing a control signal at a relatively high impedance output terminal which is conventionally applied to said first gain control terminal of said first gain controllable amplifier, and said first tuner including means for applying said control signal to said second gain control terminal of said second gain controllable amplifier, a gain control system comprising:

a first source of bias voltage;

a second source of bias voltage;

an impedance means having a first terminal coupled to said output terminal of said automatic gain control circuit and a second terminal, said impedance means presenting a high resistance to said control signal under all conditions;

a first transistor having a first base electrode coupled to said second terminal of said impedance means, a first emitter electrode and a first collector electrode;

a first resistor coupled between said first emitter electrode and a point of fixed reference voltage, said first resistor and said first transistor providing for a relatively high resistance between said first base electrode and a source of reference potential;

a second resistor coupled between said first collector electrode and said first source of bias voltage;

means coupling said first collector electrode of said first transistor to said second gain control terminal of said second gain controllable amplifier;

a second transistor having a second base electrode coupled to said second source of bias voltage, a second collector electrode coupled to said first base electrode of said first transistor and a second emitter electrode, said transistor providing limiting of said voltage applied to said high resistance terminal and a constant current through said impedance means; and a third resistor coupled between said second emitter electrode of said second transistor and said first source of bias voltage;

said second source of bias voltage being coupled to said second gain controllable amplifier to provide gain stabilization of said second gain controllable amplifier with a variation of first and second sources of bias voltage.

* * * * *